United States Patent
Dai

(10) Patent No.: US 9,136,229 B2
(45) Date of Patent: Sep. 15, 2015

(54) ELECTROSTATIC DISCHARGE PROTECTIVE DEVICE

(75) Inventor: Meng Dai, Jiangsu (CN)

(73) Assignee: CSMC TECHNOLOGIES FABI CO., LTD., Jiangsu (CN)

( * ) Notice: Subject to any disclaimer, the term of this patent is extended or adjusted under 35 U.S.C. 154(b) by 0 days.

(21) Appl. No.: 14/130,427

(22) PCT Filed: Aug. 9, 2012

(86) PCT No.: PCT/CN2012/079892
§ 371 (c)(1),
(2), (4) Date: Dec. 31, 2013

(87) PCT Pub. No.: WO2013/044692
PCT Pub. Date: Apr. 4, 2013

(65) Prior Publication Data
US 2014/0151745 A1   Jun. 5, 2014

(30) Foreign Application Priority Data

Sep. 29, 2011 (CN) .......................... 2011 1 0299454
Sep. 29, 2011 (CN) .......................... 2011 1 0303015

(51) Int. Cl.
| | |
|---|---|
| H01L 29/66 | (2006.01) |
| H01L 23/60 | (2006.01) |
| H01L 29/74 | (2006.01) |
| H01L 27/02 | (2006.01) |

(52) U.S. Cl.
CPC ............ *H01L 23/60* (2013.01); *H01L 27/0262* (2013.01); *H01L 29/7436* (2013.01); *H01L 2924/0002* (2013.01)

(58) Field of Classification Search
CPC combination set(s) only.
See application file for complete search history.

(56) References Cited

U.S. PATENT DOCUMENTS

| | | | |
|---|---|---|---|
| 5,012,317 | A | 4/1991 | Rountre |
| 2002/0122280 | A1 | 9/2002 | Ker et al. |
| 2007/0007545 | A1 | 1/2007 | Salcedo et al. |
| 2009/0236631 | A1 | 9/2009 | Chen et al. |
| 2010/0320501 | A1 | 12/2010 | Gendron et al. |

FOREIGN PATENT DOCUMENTS

| | | |
|---|---|---|
| CN | 1866511 A | 11/2006 |
| CN | 101202280 A | 6/2008 |
| CN | 101764151 A1 | 6/2010 |
| CN | 102110686 A | 6/2011 |
| JP | 10-004144 A | 1/1998 |
| WO | WO 96/22614 | 7/1996 |

*Primary Examiner* — Su C Kim
*Assistant Examiner* — Junaiden Mirsalahuddin
(74) *Attorney, Agent, or Firm* — Muncy, Geissler, Olds & Lowe, P.C.

(57) ABSTRACT

An electrostatic discharge (ESD) protection device is provided. A proper trigger voltage is determined by providing an ESD doped injection layer into a PNPN structure and adjusting the injection energy and dosage of the ESD doped injection layer; a proper holding voltage is obtained by adjusting the size of the ESD doped injection layer, thus preventing the latch-up. The self-isolation effect of the electrostatic discharge protection device is formed on the basis of an epitaxial wafer high voltage process or a silicon-on-insulator (SOI) wafer high voltage process, the ESD protective device of the present invention can prevent the device from being falsely triggered due to noise interference. Compared with other known ESD protection devices, the device has the same electrostatic protection ability, much smaller area, and much lower cost.

20 Claims, 8 Drawing Sheets

ELECTROSTATIC DISCHARGE PROTECTIVE DEVICE

FIELD OF THE INVENTION

The present disclosure relates to a structure of a semiconductor, and more particularly relates to an electrostatic discharge protection device.

BACKGROUND OF THE INVENTION

The Electrostatic Discharge (ESD) is a common natural phenomenon in our lives. A large current is produced in a short time when the electrostatic discharge occurs, which causes a catastrophic failure to the integrated circuit, thus it is an important issue causing failure in the production and application of the integrated circuit. For example, the Human-Body Model (HBM) usually occurs in the hundreds of nanoseconds, the maximum peak current may reach several amperes. While in the other modes, such as Machine Model (MM), and Charged-Device Model (CDM), the electrostatic discharge occurs in much shorter time, the current is much greater. Such a large current flows through the integrated circuit in a short time, and the generated power dissipation severely exceeds the allowable maximum value, thus the integrated circuit suffers a severely physical damage to failure. The problem can be solved from the environment and the circuit in the practical application. In the environment, the main solution is to reduce the generation of static electricity and eliminate the static electricity in time; such as using the materials difficult to produce static electricity, increasing humidity, increasing operating personnel and equipment grounding and so on. In the circuit, the main solution is to increase the electrostatic discharge tolerance of the integrated circuit, such as increasing an extra-ESD protection device or circuit to protect the internal circuit of the integrated circuit from being damaged by the electrostatic discharge.

Currently, a Silicon Controlled Rectifier (SCR) is widely used in the electrostatic discharge protection circuit of the integrated circuit due to great electrostatic discharge protection and the relatively smaller device area. Generally, the parasitic SCR according to the design of the device structure in the integrated circuit can provide an electrostatic discharge protection.

U.S. Pat. No. 5,012,317 discloses an SCR applied to electrostatic discharge protection. Referring to FIG. 1, the SCR device 10 includes a P-type substrate 11, an N-type well 12 formed on the P-type substrate, a heavily doped P-type (P+) doped region 13 and a heavily doped N-type (N+) doped region 14 formed on the N-type well 12. The P+ doped region 13 and the N+ doped region 14 are connected to a contact 17 (i.e. an input of the device 10) after connecting to each other, a heavily doped N-type (N+) doped region 15 and a heavily doped P-type (P+) doped region 16 are formed on the P-type substrate and inside the N-type well, the heavily doped N-type (N+) doped region 15 and the heavily doped P-type (P+) doped region 16 are connected to a cathode (i.e. the ground terminal of the device 10) after connecting to each other. When the P-N junction between the P-type substrate 11 and the N-type well 12 is avalanched, the SCR device is turned on, the SCR current flows through the P+ doped region 14, the N-type well 12, the P-type substrate 11, and the N+ doped region 15 and releases energy to the ground terminal. The disadvantage of this structure is: when the trigger voltage is too high (approximately 60V) and the holding voltage is too low (approximately 10V), the integrated circuits with the operating voltage of 20V-40V cannot provide an effective electrostatic discharge protection, and the risk that the integrated circuit is failure due to the latch-up in practice is greatly increased.

Chinese patent 200510071001.6 discloses an electrostatic discharge device which can control the trigger voltage. Referring to FIG. 2, an electrostatic discharge device 20 formed in a P-type substrate 21, which includes an N-type well 22, a first N+ region 24c and a first P+ region 25b isolated by a field oxide, a field oxide layer 26, a second N+ region 24a, a second P+ region 25a, and a third N+ region 24b. In which, the second P+ region 25a, the N-type well 22, and the P-type substrate 21 form an equivalent transistor, while the N-type well 22, the P-type substrate 21, and the first N+ region 24c form another equivalent transistor. The field oxide layer 26 is used to isolate the third N+ region 24b and first N+ region 24c. A first electrode is connected to the second N+ region 24a and the first P+ region 25b via a first electrical conductor 28. A second electrode is connected to the second N+ region 24a and the second P+ region 25a via a second electrical conductor 27. The electrical conductors 27 and 28 can be made of metal material. In which, the predetermined distance between the edge of the second field oxide layer adjacent to the third N+ region and the edge of the N-type well is d. The trigger voltage of the electrostatic discharge device is determined by adjusting the predetermined distance. The disadvantage of this structure is that the holding voltage cannot be effectively controlled; it is unable to resolve the risk that the integrated circuit is failure due to the latch-up effect.

SUMMARY OF THE INVENTION

Accordingly to this, it is desired to provide an electrostatic discharge protection device with an appropriate trigger voltage and the holding voltage.

An electrostatic discharge protection device includes a P-type substrate, a P-type epitaxial layer, an N-type buried layer, a first N-type well, a first P-type well, a second N-type well, an ESD doped injection layer, a first N+ region, a first P+ region, a second N+ region, and a second P+ region. The P-type epitaxial layer is disposed on the P-type substrate; the N-type buried layer is disposed between the P-type substrate and the P-type epitaxial layer; the first N-type well is disposed on the N-type buried layer, inside the P-type epitaxial layer; the first P-type well is disposed on the N-type buried layer, and adjacent to the first N-type well; the second N-type well is disposed on the N-type buried layer, between the first P-type well and the P-type epitaxial layer; the ESD doped injection layer is disposed in the first P-type well and the first N-type well; the first N+ region, and the first P+ region are disposed in the ESD doped injection layer; the second N+ region, and the second P+ region are disposed inside the ESD doped injection layer, and disposed in the first N-type well or the first P-type well with a conductivity type opposite to the ESD doped injection layer.

Another electrostatic discharge protection device is also provided. The electrostatic discharge protection device includes a P-type substrate, an oxide layer, a first N-type well, a first P-type well, a first trench, a second trench, an ESD doped injection layer, a first N+ region, a first P+ region, a second N+ region, and a second P+ region. The oxide layer is disposed on a side of the P-type substrate. The first N-type well is disposed on the other side of the oxide layer. The first P-type well is disposed on the side of the oxide layer, and adjacent to the first N-type well; the first N-type well and the first P-type well are on the same side of the oxide layer. The first trench is defined on a side of the oxide layer and adjacent to the first N-type well; the second trench is defined on the same side of oxide layer and adjacent to the first P-type well. The ESD doped injection layer is disposed in the P-type well and the first N-type well. The first N+ region and the first P+ region are disposed on a side of the ESD doped injection layer. The second N+ region, and the second P+ region are disposed in the first N-type well or the first P-type well with a conductivity type opposite to the ESD doped injection layer.

Compared with the prior art, an ESD doped injection layer is introduced to the PNPN structure of the prior art, the appropriate trigger voltage and holding voltage can be obtained by adjusting the ESD doped injection layer. A self-isolation effect formed based on an epitaxial wafer high voltage process or an SOI wafer high voltage process can prevent the device from being falsely triggered due to noise effect. In addition, compared with other conventional electrostatic protection devices, the electrostatic protection device has a much smaller area and a lower manufacturing cost on premise of the same electrostatic protection capability.

DETAILED DESCRIPTION OF THE EMBODIMENTS

Figure 1:
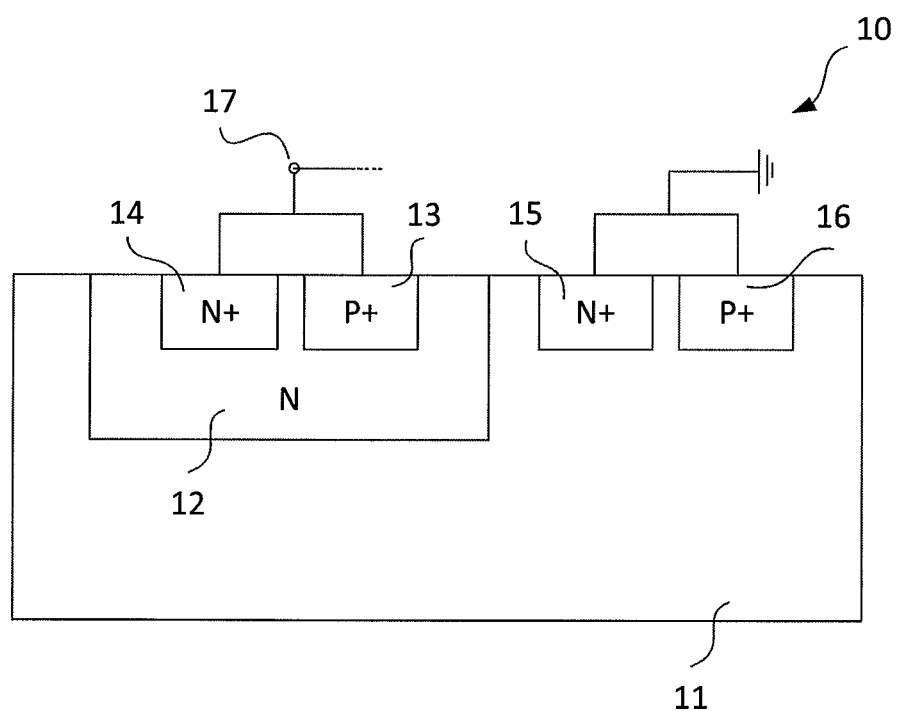
FIG. 1 is a cross-sectional side view of a conventional SCR applied to a electrostatic protection circuit.
Figure 2:
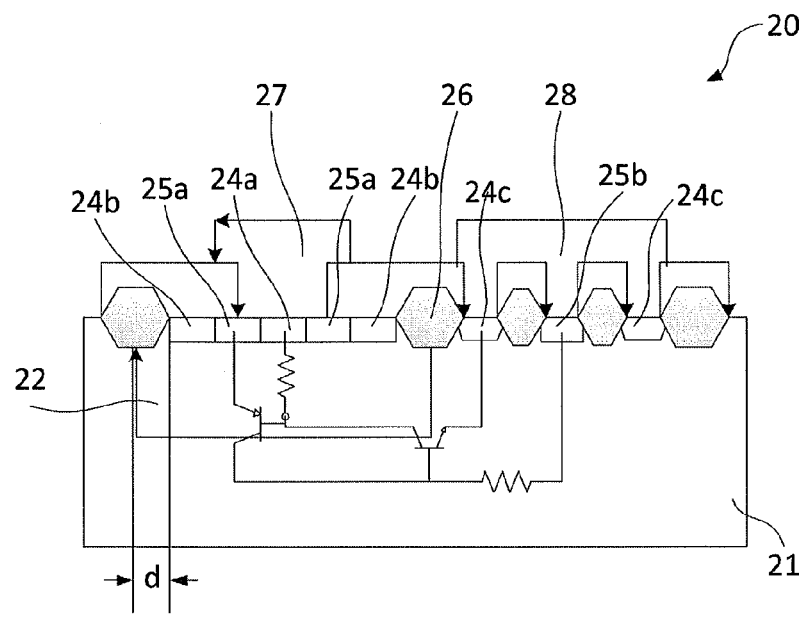
FIG. 2 is a cross-sectional side view of another conventional electrostatic protection device which can control the trigger voltage.

Reference will now be made in detail to the preferred embodiments of the invention, examples of which are illustrated in the accompanying drawings. Wherever possible, the same reference numbers are used in the drawings and the description to refer the same or like parts.

Figure 3:
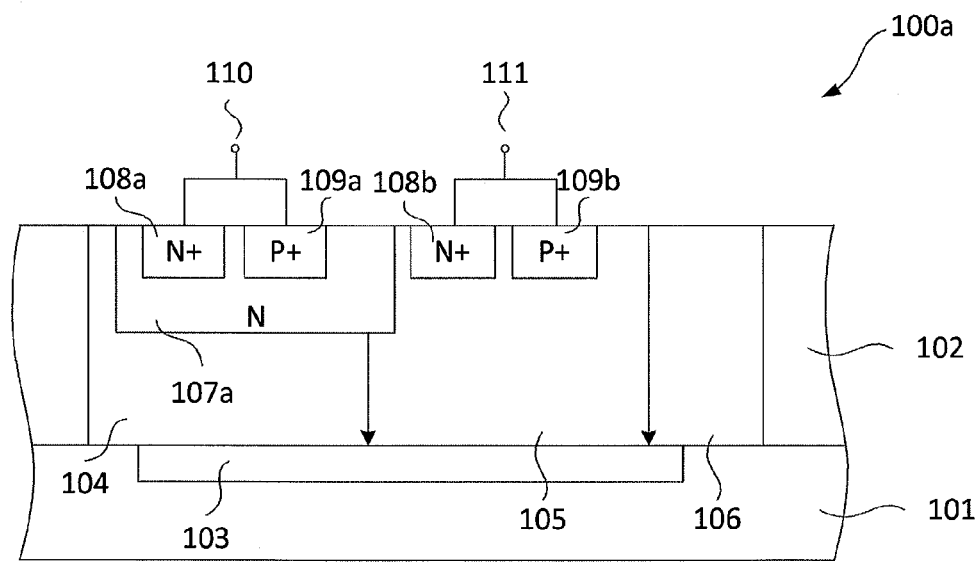
FIG. 3 is a cross-sectional view of an electrostatic protection device of a preferred embodiment of the present disclosure.

An electrostatic protection device is provided in the present disclosure. In a preferred embodiment, the electrostatic protection device is manufactured by an epitaxial wafer high voltage process. FIG. 3 is a cross-sectional view of an electrostatic protection device of a preferred embodiment of the present disclosure. In the illustrated embodiment, the EDS doped injection layer is N-type doping. Referring to FIG. 3, the electrostatic protection device includes a single electrostatic discharge protection unit 100a, which includes a P-type substrate 101, a P-type epitaxial layer 102, an N-type buried layer 103, a first N-type well 104, a first P-type well 105, a second N-type well 106, an ESD doped injection layer 107a, a first N+ region 108a, a first P+ region 109a, a second N+ region 108b, a second P+ region 109b, an anode 110, and a cathode 111.

The P-type epitaxial layer 102 is formed on the P-type substrate 101. The N-type buried layer 103 is disposed between the P-type substrate 101 and the P-type epitaxial layer 102. The first N-type well 104 and the first P-type well 105 are disposed on the N-type buried layer 103, inside the P-type epitaxial layer 102, and adjacent to each other. The N-type ESD doped injection layer 107a is disposed in the first N-type well 104 and the first P-type well 105. The first N+ region 108a and the first P+ region 109a are disposed in the N-type ESD doped injection layer 107a. The second N+ region 108b and the second P+ region 109b are disposed in the first P-type well 105 and not connected to the N-type ESD doped injection layer 107a. The first N+ region 108a and the first P+ region 109a are connected to the anode 110. The second N+ region 108b and the second P+ region 109b are connected to the cathode 111.

Referring to FIG. 3, the first P+ region 109a, the N-type ESD doped injection layer 107a, the first N-type well 104, the first P-type well 105, and the second N+ region 108b form a P-N-N(ESD implant)-P-N device structure; the first N+ region 108a is the lead of the first N-type well 104, the second P+ region 109b is the lead of the first P-type well 105. When the electrostatic protection device is applied in the integrated circuit, the first N+ region 108a and the first P+ region 109a are connected to form the anode 110 and connect to a high potential; the second N+ region 108b and the second P+ region 109b are connected to form the cathode 110 and connect to a low potential. The N-type buried layer 103, the first N-type well 104, and the second N-type well 106 are used to isolate the electrostatic protection device and the protected integrated circuit, and prevent the device from being falsely triggered due to noise effect.

Figure 4:
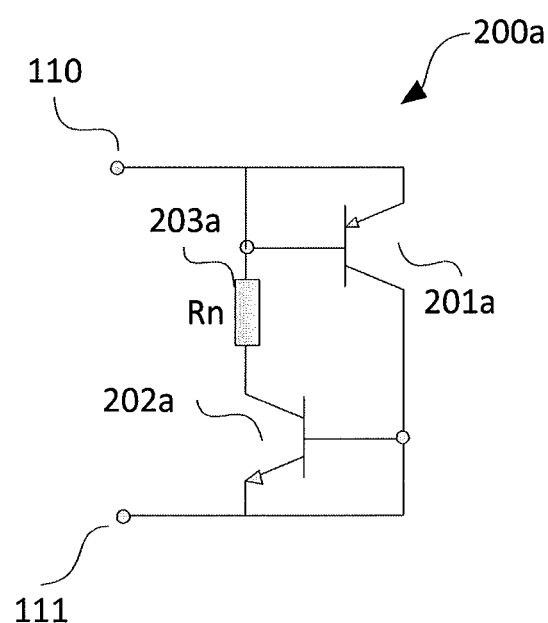
FIG. 4 is an equivalent circuit diagram of the electrostatic protection device shown in FIG. 3.

FIG. 4 is an equivalent circuit diagram 200a of the electrostatic protection device shown in FIG. 3. Referring to FIG. 3 and FIG. 4, the first P+ region 109a is equivalent to a emitter of a PNP transistor 201a; the first N-type well 104 and the N-type ESD doped injection layer 107a are equivalent to a base of the transistor 201a; the first P-type well 105 is equivalent to a collector of the transistor 201a. The first N-type well 104 and the N-type ESD doped injection layer 107a are equivalent to a collector of the NPN transistor 202a; the first P-type well 105 is equivalent to a base of the transistor 202a; the second N+ region 108b is equivalent to a emitter of the transistor 202a. In the FIG. 4, a resistance 203a is regard as an equivalent resistance of the N-type ESD doped injection layer 107a and recorded as Rn. The resistance Rn is connected to the anode 110 via the first N-type well 104. The trigger voltage of the self-isolation electrostatic protection device is a smaller value of the BVceo of the transistor 201a and the Bvceo of the transistor 202a. The BVceo of the transistor 201a and the transistor 202a can be determined by adjusting the injection energy and dose of the N-type ESD doped injection layer 107a, i.e. the trigger voltage can be determined by adjusting the injection energy and dose of the doped injection layer; thus the trigger voltage of the electrostatic protection device can be adjusted according to the requirement of the protection circuit.

In application, the electrostatic protection device is connected to an integrated circuit to be protected in parallel. The anode 110 is connected to the high potential; the cathode 111 is connected to the low potential. When the integrated circuit is in a normal operation, the electrostatic protection device will not be triggered, which is in a low leakage state similar to the reverse-biased diode. Referring to FIG. 4, the self-isolation electrostatic protection device is breakdown when a static electricity occurs. Due to the present of the parasitic resistance 203a, both the transistor 201a and the transistor 202a are opened to a amplification status, the breakdown current is amplified by the transistors 201a to form the base current of transistor 202a, and then is amplified by the transistor 202a to form the base current of the transistor 201a. The breakdown current is constantly amplified to form a positive feedback when the product of the common base current gain is greater than 1, repeatedly, the current gain of transistor 201a and transistor 202a decreases with the increasing of the current until equilibrium, and the electrostatic discharge protection device is triggered into the low on-state. The self-isolation electrostatic discharge protection device has a great current conduction capability, thus the static current can be safely discharged.

Referring to FIG. 4, due to the presence of the parasitic resistance 203a, the holding voltage of the self-isolation electrostatic discharge protection device after triggering is proportional to the resistance 203a. The greater the resistance 203a, the higher the holding voltage of the self-isolation electrostatic discharge protection device. The resistance 203a can reach the optimum value by adjusting the size of the ESD doped injection layer 107a. Accordingly, the appropriate holding voltage can be obtained by adjusting the size of the ESD doped injection layer 107a. Moreover, the holding voltage is adjusted to greater than the operating voltage to avoid the latch-up.

Figure 5:
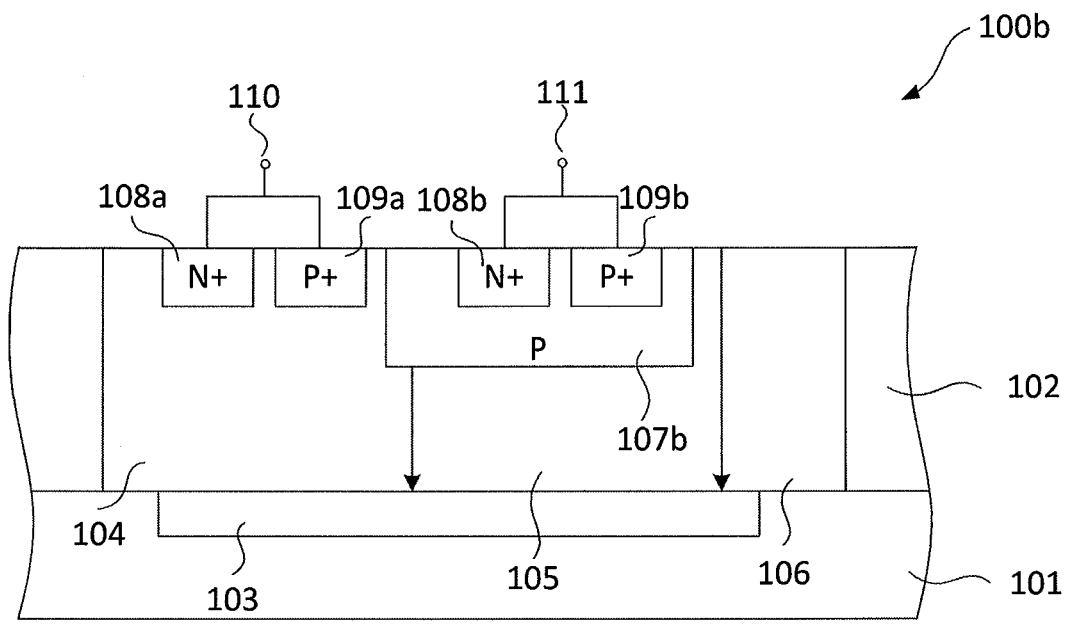
FIG. 5 is a cross-sectional view of an electrostatic protection device of another preferred embodiment of the present disclosure.

FIG. 5 is a cross-sectional view of an electrostatic protection device of another preferred embodiment of the present disclosure. In the illustrated embodiment, the ESD doped injection layer is P-type doping. Referring to FIG. 5, the electrostatic discharge protection device includes a single electrostatic discharge protection unit 100b, which includes a P-type substrate 101, a P-type epitaxial layer 102, an N-type buried layer 103, a first N-type well 104, a first P-type well 105, a second N-type well 106, an ESD doped injection layer 107b, a first N+ region 108a, a first P+ region 109a, a second N+ region 108b, a second P+ region 109b, an anode 110, and a cathode 111.

Referring to FIG. 5 and FIG. 3, the electrostatic discharge protection unit 100b is the same as the electrostatic discharge protection unit 100a shown in FIG. 3, The P-type substrate 101, the P-type epitaxial layer 102, the N-type buried layer 103, the first N-type well 104, the first P-type well 105, and the second N-type well 106 of the electrostatic discharge protection unit 100b and the electrostatic discharge protection unit 100a are similar to each other, which are not described here in detail. In the electrostatic discharge protection unit 100b shown in FIG. 5, the P-type ESD doped injection layer 107b is disposed in the first N-type well 104 and the first P-type well 105. The first N+ region 108a and the first P+ region 109a are disposed in the first N-type well 104. The second N+ region 108b and the second P+ region 109b are disposed in P-type ESD doped injection layer 107b. The first N+ region 108a and the first P+ region 109a are not connected to the P-type ESD doped injection layer 107b. The first N+ region 108a and the first P+ region 109a are connected to the anode 110; the second N+ region 108b and the second P+ region 109b are connected to the cathode 111.

Figure 6:
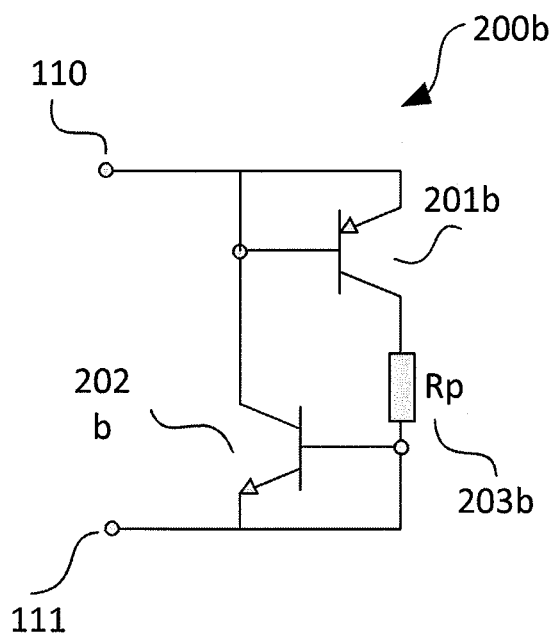
FIG. 6 is an equivalent circuit diagram of the electrostatic protection device shown in FIG. 5.

FIG. 6 is an equivalent circuit diagram of the electrostatic protection device shown in FIG. 5. Referring to FIG. 6 and FIG. 5, the first P+ region 109a is equivalent to an emitter of a PNP transistor 201b; the first N-type well 104 is equivalent to a base of the transistor 201b; the first P-type well 105 and the N-type ESD doped injection layer 107b are equivalent to a collector of the transistor 201b. The first N-type well 104 is equivalent to a collector of the NPN transistor 202b; the first P-type well 105 and the N-type ESD doped injection layer 107b are equivalent to a base of the transistor 202b; the second N+ region 108b is equivalent to a emitter of the transistor 202b. A resistance 203b is regard as an equivalent resistance of the N-type ESD doped injection layer 107b, recorded as Rp. The resistance Rp is connected to the cathode 111 via the first P-type well 105. The trigger voltage can also be determined by adjusting the injection energy and dose of the doped injection layer 107b; thus the trigger voltage of the electrostatic protection device can be adjusted according to the requirement of the protection circuit.

Referring to FIG. 6, the self-isolation electrostatic protection device is breakdown when a static electricity occurs. Due to the presence of the parasitic resistance 203b, i.e. the Rp, the working principle is the same as that shown in FIG. 4. The self-isolation electrostatic discharge protection device has a great current conduction capability due to the amplification of the PNP transistor 201b and the NPN transistor 202b, thus the static current can be safely discharged. Due to the presence of the parasitic resistance 203b, i.e. the Rp, the holding voltage of the self-isolation electrostatic discharge protection device after triggering is proportional to the resistance Rp. The greater the resistance Rp, the higher the holding voltage of the self-isolation electrostatic discharge protection device. The resistance Rp can reach the optimum value by adjusting the size of the ESD doped injection layer 107a. Accordingly, the appropriate holding voltage can be obtained by adjusting the size of the ESD doped injection layer 107a. Moreover, the holding voltage is adjusted to greater than the operating voltage to avoid the latch-up.

Figure 7:
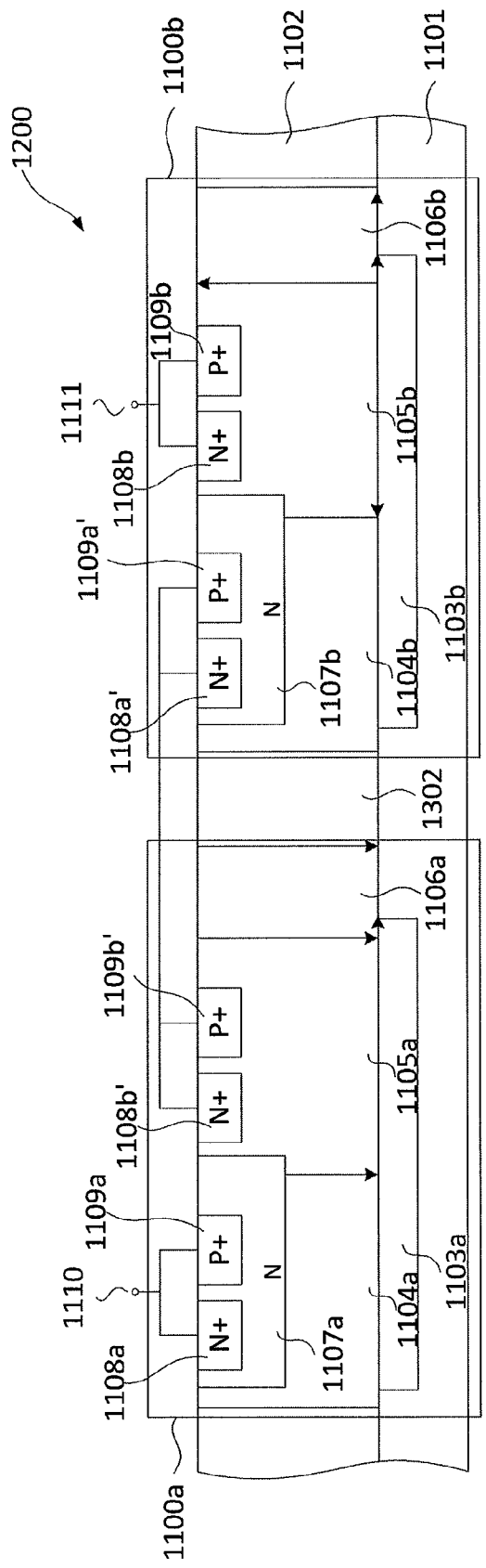
FIG. 7 is a cross-sectional view of an electrostatic protection device of a preferred embodiment of the present disclosure.

FIG. 7 is a cross-sectional view of an electrostatic protection device of a preferred embodiment of the present disclosure. In the illustrated embodiment, the electrostatic discharge protection device 1200 includes an electrostatic discharge protection unit 1100a, an electrostatic discharge protection unit 1100b manufactured by the epitaxial wafer high voltage process, and a second P-type well 1302. The structure of electrostatic discharge protection units 1100a and 1100b shown in the dashed box of FIG. 7 are the same. Take the electrostatic discharge protection unit 1100a as an example, which includes a P-type substrate 1101, a P-type epitaxial layer 1102, an N-type buried layer 1103a, a first N-type well 1104a, a first P-type well 1105a, a second N-type well 1106a, an ESD doped injection layer 1107a, a first N+ region 1108a, a first P+ region 1109a, a second N+ region 1108b', a second P+ region 1109b', an anode 1110, and a cathode 1111. The P-type epitaxial layer 1102 is formed on the P-type substrate 1101. The N-type buried layer 1103a is formed between the P-type substrate 1101 and the P-type epitaxial layer 1102. The first N-type well 1104a and the first P-type well 1105a are disposed on the N-type buried layer 1103a and inside the P-type epitaxial layer 1102. The second N-type well 1106 is disposed in the P-type epitaxial layer 1102. The first N-type well 1104a is adjacent to the first P-type well 1105a. The first P-type well 1105a is adjacent to the second N-type well 1106. The N-type ESD doped injection layer 1107a is disposed in the first N-type well 1104a and the first P-type well 1105a. The first N+ region 1108a and the first P+ region 1109a are disposed in the N-type ESD doped injection layer 1107a. The second N+ region 1108b' and the second P+ region 1109b' are disposed inside the N-type ESD doped injection layer 1107a and in the first P-type well 1105a. The structure of the electrostatic discharge protection unit 1100b is the same of that of the electrostatic discharge protection unit 1100a. The two electrostatic discharge protection units are connected via the second P-type well 1302.

The second P-type well 1302 is further connected to the N-type buried layers 1103a and 1103b, the first N-type wells 1104a and 1104b, and the second N-type wells 1106a and 1106b, thus the electrostatic discharge protection device 1200 is isolated to the protected integrated circuit. The second N+ region 1108b' and the second P+ region 1109b' of the electrostatic discharge protection unit 1100a are electrically connected to the third N+ region 1108a' and the third P+ region 1109a' of the electrostatic discharge protection unit 1100b. The first N+ region 1108a and the first P+ region 1109a of the electrostatic discharge protection unit 1100a are connected to the anode 1110; the fourth N+ region 1108b and the fourth P+ region 1109b of the electrostatic discharge protection unit 1100b are connected to the cathode 1111. In the illustrated embodiment, both the ESD doped injection layers 1107a and 1107b are N-type doping. It should be noted that, alternatively, the ESD doped injection layer can be N-type doping or P-type doping, and the doping types of the ESD of the electrostatic discharge protection units connected in series can be different, which is not limited by the illustrated embodiment.

Referring to FIG. 7, the first P+ region 1109a, the N-type ESD doped injection layer 1107a, the first N-type well 1104a of the electrostatic discharge protection unit 1100a, the N-type ESD doped injection layer 1107b, the first P-type well 1105, and the second N+ region 1108b of the electrostatic discharge protection unit 1100b form the P-N-N (ESD implant)-P-N device structure. The first N+ region 1108a of the electrostatic discharge protection unit 1100a is the lead of the first N-type well 1104a; the fourth P+ region 1109a of the electrostatic discharge protection unit 1100b is the lead of the first P-type well 1105b. When the electrostatic protection device 1200 is applied to the integrated circuit, the first N+ region 1108a and the first P+ region 1109a of the electrostatic discharge protection unit 1100a are connected to the anode 1110 to connect to a high potential; the fourth N+ region 1108b and the fourth P+ region 1109b of the electrostatic discharge protection unit 1100b are connected the cathode 1111 to connect to a low potential. The N-type buried layer 1103a, the first N-type well 1104a of the electrostatic discharge protection unit 1100a, and the N-type buried layer 1103b and the second N-type well 1106b are used to isolate the electrostatic protection device 1200 and the protected integrated circuit to prevent the device from being falsely triggered due to noise effect.

Figure 8:
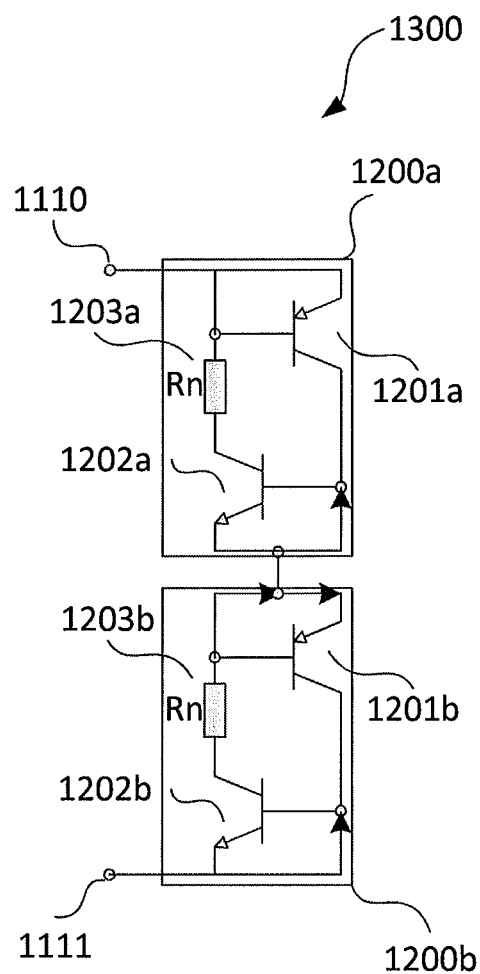
FIG. 8 is an equivalent circuit diagram of the electrostatic protection device shown in FIG. 7.

FIG. 8 is an equivalent circuit diagram 1300 of the electrostatic protection device 1200 shown in FIG. 7. The dashed boxes 1200a and 1200b are the equivalent circuit diagram of the electrostatic protection units 1100a and 1100b. Referring to FIG. 8 and FIG. 7, the first P+ region 1109a of the electrostatic discharge protection unit 1100a is equivalent to a emitter of a PNP transistor 1201a; the first N-type well 1104a and the N-type ESD doped injection layer 1107a of the electrostatic discharge protection unit 1100a are equivalent to a base of the PNP transistor 1201a; the first P-type well 1105a of the electrostatic discharge protection unit 1100a is equivalent to a collector of the PNP transistor. The first N-type well 1104a and the N-type ESD doped injection layer 1107a of the electrostatic discharge protection unit 1100a are equivalent to a collector of the NPN transistor 1202a; the first P-type well 1105a of the electrostatic discharge protection unit 1100a is equivalent to a base of the NPN transistor 1202a; the second N+ region 1108b' of the electrostatic discharge protection unit 1100a is equivalent to a emitter of the NPN transistor 1202a. A resistance 1203a is regard as an equivalent resistance of the N-type ESD doped injection layer 1107a of the electrostatic discharge protection unit 1100a, recorded as Rn. The resistance 1203a is connected to the anode 1110 via the first N-type well 1104a of the electrostatic discharge protection unit 1100a. The trigger voltage of the self-isolation electrostatic protection device is the smaller value of the BVceo of the PNP transistor 1201a and the Bvceo of the NPN transistor 1202a. The BVceo of the PNP transistor 1201a and the NPN transistor 1202a can be determined by adjusting the injection energy and dose of the N-type ESD doped injection layer 1107a, i.e. the trigger voltage can be determined by adjusting the injection energy and dose of the doped injection layer; thus the trigger voltage of the electrostatic protection device can be adjusted according to the requirement of the protection circuit. The trigger voltage doubles when the electrostatic discharge protection units 1100a and 1100b are connected in series, while the doubling of the trigger voltage is limited by the withstand voltage of the peripheral isolation structure, the trigger voltage of the device can reach tens of volts after being connected in series.

In application, the electrostatic protection device is connected to an integrated circuit to be protected in parallel. The anode 1110 is connected to the high potential; the cathode 1111 is connected to the low potential. When the integrated circuit is in a normal operation, the electrostatic protection device will not be triggered, which is in a low leakage state similar to the reverse-biased diode. Referring to FIG. 8, the self-isolation electrostatic protection device is breakdown when a static electricity occurs. Due to the present of the resistance 1203a and resistance 1203b, the PNP transistors 1201a, 1201b, and the NPN transistors 1202a and 1202b are opened to a amplification status, the breakdown current is amplified by the PNP transistors to form the base current of the NPN transistors, and then amplified by the NPN transistors to form the base current of the PNP transistors. The breakdown current is constantly amplified to form a positive feedback when the product of the common base current gain of the PNP transistors and the NPN transistors is greater than 1, repeatedly, the current gain of the PNP transistors and the NPN transistors decreases with the increasing of the current until equilibrium, and the electrostatic discharge protection device is triggered into the low on-state. The self-isolation electrostatic discharge protection device has a great current conduction capability due to the amplification of the PNP transistors and the NPN transistors, thus static current can be safely discharged.

Referring to FIG. 8, due to the presence of the resistances 1203a and 1203b, the holding voltage of the self-isolation electrostatic protection device after triggering is proportional to the resistances 1203a and 1203b. The greater the resistance value Rn of the resistances 1203a and 1203b, the higher the holding voltage of the self-isolation electrostatic discharge protection device. The resistance value Rn of the resistances 1203a and 1203b can reach the optimum value by adjusting the size of the ESD doped injection layer 1107a and 1107b. Accordingly, the appropriate holding voltage can be obtained by adjusting the size of the ESD doped injection layer. Moreover, the holding voltage is adjusted to greater than the operating voltage to avoid the latch-up.

Figure 9:
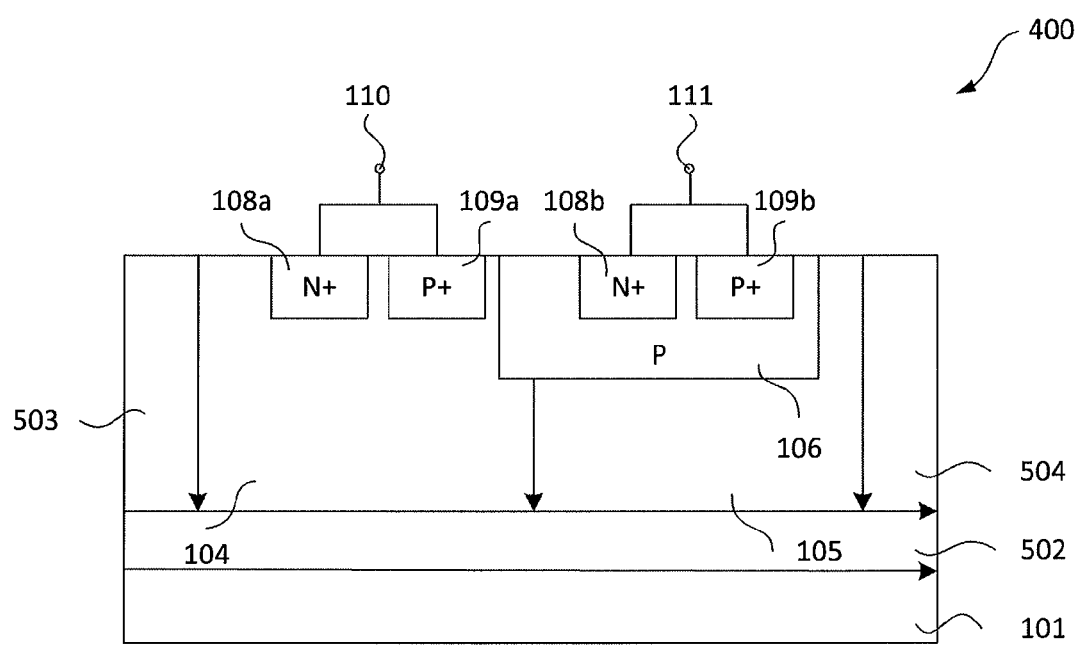
FIG. 9 is a cross-sectional view of an electrostatic protection device of another preferred embodiment of the present disclosure.

FIG. 9 is a cross-sectional view of an electrostatic protection device of another preferred embodiment of the present disclosure. In a preferred embodiment, the electrostatic protection device is on the basis of the SOI wafer high voltage process. Partial structures of the electrostatic protection device of the illustrated embodiment are the same as those of the electrostatic protection device shown in the FIG. 3 and FIG. 5, the reference signs are the same. Referring to FIG. 9, the electrostatic protection device 400 includes a P-type substrate 101, an oxide layer 502, a first N-type well 104, a first P-type well 105, a first trench 503, a second trench 504, an ESD doped injection layer 107, a first N+ region 108a, a first P+ region 109a, a second N+ region 108b, a second P+ region 109b, an anode 110, and a cathode 111. Referring to FIG. 9, the oxide layer 502 is formed on the P-type substrate 101. The first N-type well 104 and the first P-type well 105 are formed on the oxide layer 502. The first trench 503 and the second trench 504 are defined on the oxide layer 502. The first trench 503, the first N-type well 104, the first P-type well 105, and the second trench 504 are adjacent in order. The P-type ESD doped injection layer 107b is formed in the first N-type well 104 and the first P-type well 105. The second N+ region 108b and the second P+ region 109b are disposed in the P-type ESD doped injection layer 107b. The first N+ region 108a and the first P+ region 109a are formed in the first N-type well 104 and inside the P-type ESD doped injection layer 107b. The first N+ region 108a and the first P+ region 109a are connected to the anode 110; the second N+ region 108b and the second P+ region 109b are connected to the cathode 111.

In the illustrated embodiment, the ESD doped injection layer 107b is P-type doping, it should be noted that, the ESD doped injection layer 107b can be N-type doping or P-type doping, which is not limited by the illustrated embodiment. The electrostatic protection device of the illustrated embodiment is similar to that shown in FIG. 3 and FIG. 5, which is not described here in detail again. In the illustrated embodiment, the appropriate trigger voltage and holding voltage can be obtained by adjusting the injection dose and energy of the ESD doped injection layer 107b.

Referring to FIG. 9, in application, the electrostatic protection device is connected to an integrated circuit to be protected in parallel. The anode 110 is connected to the high potential; the cathode 111 is connected to the low potential. When the integrated circuit is in a normal operation, the electrostatic protection device will not be triggered, which is in a low leakage state similar to the reverse-biased diode. The self-isolation electrostatic protection device is breakdown when a static electricity occurs. The working principle of the protection is the same as that of the electrostatic protection device manufactured by the epitaxial wafer high voltage process shown in FIG. 3 and FIG. 5. The difference is: the isolation structure is formed by the N-type well and the N-type buried layer in the epitaxial wafer high voltage process, while the isolation structure is formed by the oxide layer and the trench in the SOI wafer high voltage process. The oxide layer 502 forms the isolation on the bottom of the device, and the first trench 203 and the second trench 504 form the isolation on the periphery of the device. The electrostatic protection device has a much higher trigger voltage because the breakdown voltage of the isolation structure of the oxide layer and the trench is much higher.

The electrostatic protection device of the present disclosure can be applied in the device with an operating voltage more than 5V in the high voltage environment.

Figure 10:
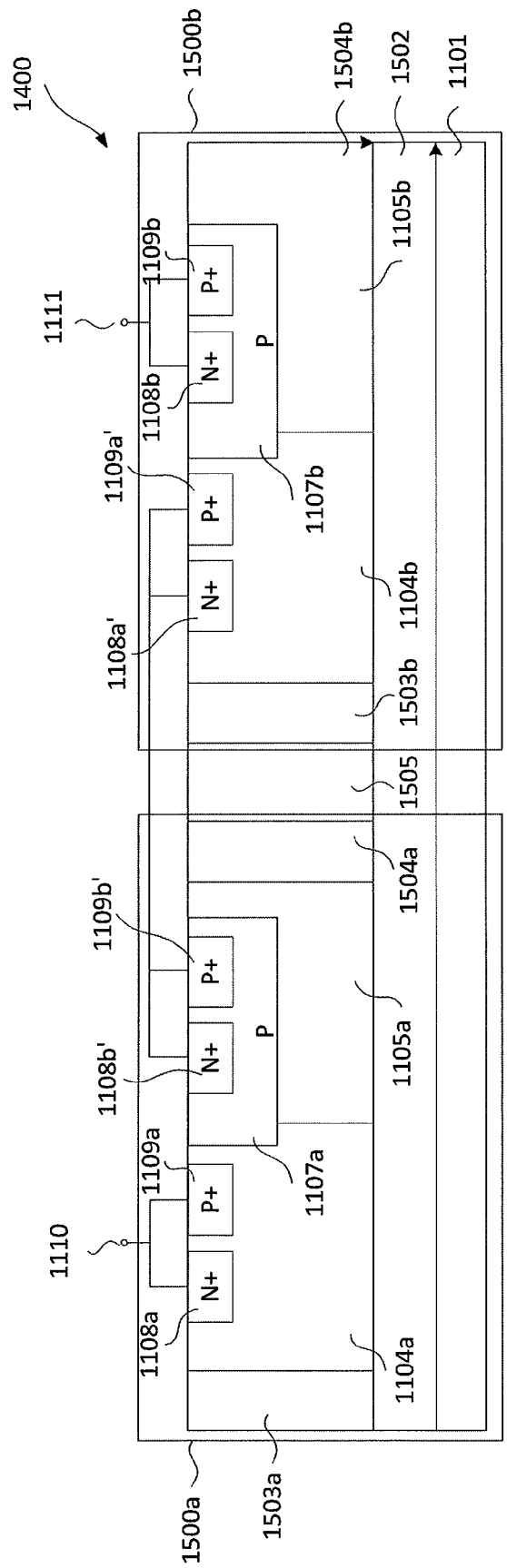
FIG. 10 is an equivalent circuit diagram of the electrostatic protection device shown in FIG. 9.

FIG. 10 is a cross-sectional view of an electrostatic protection device of another embodiment of the present disclosure. In a preferred embodiment, the electrostatic protection device is on the basis of the SOI wafer high voltage process. Partial structures of the electrostatic protection device of the illustrated embodiment are the same as those of the electrostatic protection device shown in the FIG. 7, the reference signs are the same. Referring to FIG. 10, the electrostatic protection device includes electrostatic discharge protection units 1500a, 1500b, and an isolation structure 1505. The structures of the electrostatic discharge protection unit 1500a and 1500b shown in the dashed box of FIG. 10 are the same. Take the electrostatic discharge protection unit 1500a as an example, the electrostatic protection device unit 1500a includes a P-type substrate 1101, an oxide layer 1502, a first N-type well 1104a, a first P-type well 1105a, a first trench 1503a, a second trench 1504a, an ESD doped injection layer 1107a, a first N+ region 1108a, a first P+ region 1109a, a second N+ region 1108b', a second P+ region 1109b', an anode 1110, and a cathode 1111. The oxide layer 1502 is formed on the P-type substrate 1101. The first N-type well 1104a and the first P-type well 1105a are formed on the oxide layer 1502. The first trench 1503a and the second trench 1504a are defined on the oxide layer 1502. The first trench 1503a, the first N-type well 1104a, the first P-type well 1105a, and the second trench 1504a are adjacent in order. The P-type ESD doped injection layer 1107a is formed in the first N-type well 1104a and the first P-type well 1105a. The second N+ region 1108 b' and the second P+ region 1109b' are disposed in the P-type ESD doped injection layer 1107a. The first N+ region 1108a and the first P+ region 1109a are formed in the first N-type well 1104a and inside the P-type ESD doped injection layer 1107a. The structure of the electrostatic discharge protection unit 1500b is the same as that of the electrostatic discharge protection unit 1500a. The two electrostatic discharge protection units are connected via the isolation structure 1505, which is further connected to the oxide layer 1502, the first trenches 1503a and 1503b, and the second trenches 1504a and 1504b to isolate the electrostatic protection device 1400 and the protected integrated circuit. It should be noted that, the first N+ region 1108a and the first P+ region 1109a of the electrostatic protection unit 1500a are connected to form the anode 1110 and connect to a high potential; the fourth N+ region 1108b and the fourth P+ region 1109b of the electrostatic protection unit 1500b are connected to form the cathode 1111 and connect to a low potential. The second N+ region 1108b' and the second P+ region 1109b' of the electrostatic discharge protection unit 1500a are electrically connected to the third N+ region 1108a' and the third P+ region 1109a' of the electrostatic discharge protection unit 1500b. In the illustrated embodiment, both the ESD doped injection layers 1107a and 1107b are P-type doping. It should be noted that, alternatively, the ESD doped injection layer can be N-type doping or P-type doping, and the doping types of the ESD of the electrostatic discharge protection units connected in series can be different, which is not limited by the illustrated embodiment.

Referring to FIG. 10, the electrostatic protection device 1400 is connected to an integrated circuit to be protected in parallel. The anode 1110 is connected to the high potential; the cathode 1111 is connected to the low potential. When the integrated circuit is in a normal operation, the electrostatic protection device will not be triggered, which is in a low leakage state similar to the reverse-biased diode. The self-isolation electrostatic protection device is breakdown when a static electricity occurs. The working principle of the protection is the same as that of the electrostatic protection device manufactured by the epitaxial wafer high voltage process, while the isolation structure is formed by the oxide layer and the trench in the SOI wafer high voltage process to replace the N-type well and the N-type buried layer in the epitaxial wafer high voltage process. The oxide layer 1502 forms the isolation on the bottom of the device, and the first trench 1503a and the second trench 1504b forms the isolation on the periphery of the device. The electrostatic protection device has a much higher trigger voltage because the breakdown voltage of the oxide layer and trench structure is much higher.

The appropriate trigger voltage and the holding voltage can be obtained by adjusting the injection energy and dose of the doped injection layer. The trigger voltage of the electrostatic protection device based on the SOI wafer high voltage process is more than 100V because the breakdown voltage of the oxide layer and trench structure is much higher.

The electrostatic protection device of the present disclosure can be applied to the device with an operating voltage more than 5V in the high voltage environment.

Although the present invention has been described with reference to the embodiments thereof and the best modes for carrying out the present invention, it is apparent to those skilled in the art that a variety of modifications and changes may be made without departing from the scope of the present invention, which is intended to be defined by the appended claims.

What is claimed is:

1. An electrostatic discharge protection device, comprising an electrostatic discharge protection unit, wherein the electrostatic discharge protection unit comprises:
    a P-type substrate;
    a P-type epitaxial layer disposed on the P-type substrate;
    an N-type buried layer disposed between the P-type substrate and the P-type epitaxial layer;
    a first N-type well disposed on the N-type buried layer and inside the P-type epitaxial layer;
    a first P-type well disposed on the N-type buried layer and inside the P-type epitaxial layer, the first P-type well being adjacent to the first N-type well;
    a second N-type well disposed on the N-type buried layer and inside the P-type epitaxial layer, and adjacent to the first P-type well;
    an ESD doped injection layer disposed in the first P-type well and the first N-type well;
    a first N+ region and a first P+ region disposed in the ESD doped injection layer; and
    a second N+ region and a second P+ region disposed outside the ESD doped injection layer, wherein the second N+ region and the second P+ region are disposed in the first N-type well or the first P-type well with a conductivity type opposite to the ESD doped injection layer.

2. The electrostatic discharge protection device according to claim 1, wherein a number of the electrostatic discharge protection unit is at least two, the at least two electrostatic discharge protection units are connected in series.

3. The electrostatic discharge protection device according to claim 2, wherein the electrostatic discharge protection units are connected in series by a second P-type well.

4. The electrostatic discharge protection device according to claim 3, wherein the second P-type well is disposed inside the P-type epitaxial layer, the second P-type well is connected to the second N-type well of a former electrostatic discharge protection unit, and connected to the first N-type well of the latter electrostatic discharge protection unit.

5. The electrostatic discharge protection device according to claim 1, wherein the ESD doped injection layer is N-type doping or P-type doping.

6. The electrostatic discharge protection device according to claim 2, wherein the ESD doped injection layer is N-type doping or P-type doping, the doping types of the ESD doped injection layers of two adjacent electrostatic discharge protection units are different.

7. The electrostatic discharge protection device according to claim 1, further comprising:
    a first electrode connected to the first N+ region and the first P+ region;
    a second electrode connected to the second N+ region and the second P+ region.

8. The electrostatic discharge protection device according to claim 1, wherein a trigger voltage of the electrostatic discharge protection device is determined by an injection dose and energy of the ESD doped injection layer.

9. The electrostatic discharge protection device according to claim 1, wherein a holding voltage of the electrostatic discharge protection device is determined by a size of the ESD doped injection layer.

10. The electrostatic discharge protection device according to claim 1, wherein the electrostatic discharge protection device is manufactured by an epitaxial wafer high voltage process.

11. An electrostatic discharge protection device, comprising an electrostatic discharge protection unit, wherein the electrostatic discharge protection unit comprises:
    a P-type substrate;
    an oxide layer formed on the P-type substrate;
    a first N-type well formed on the oxide layer;
    a first P-type well formed on the oxide layer and adjacent to the first N-type well;
    a first trench defined on the oxide layer and adjacent to the first N-type well;
    a second trench defined on the oxide layer and adjacent to the first P-type well;
    an ESD doped injection layer formed in the P-type well and the first N-type well;
    a first N+ region and a first P+ region disposed in the ESD doped injection layer in parallel;
    a second N+ region and a second P+ region disposed outside the ESD doped injection layer in parallel, wherein the second N+ region and the second P+ region are disposed in the first N-type well or the first P-type well with a conductivity type opposite to the ESD doped injection layer.

12. The electrostatic discharge protection device according to claim 11, wherein a number of the electrostatic discharge protection unit is at least two, the at least two electrostatic discharge protection units are connected in series.

13. The electrostatic discharge protection device according to claim 12, wherein the electrostatic discharge protection units are connected in series by a spacer structure.

14. The electrostatic discharge protection device according to claim 13, wherein the spacer structure is formed on the oxide layer, the spacer structure is adjacent to the second trench of a former electrostatic discharge protection unit, and adjacent to the first trench of a latter electrostatic discharge protection unit.

15. The electrostatic discharge protection device according to claim 13, wherein the spacer structure is a P-type well or an N-type well.

16. The electrostatic discharge protection device according to claim 11, wherein the ESD doped injection layer is N-type doping or P-type doping.

17. The electrostatic discharge protection device according to claim 12, wherein the ESD doped injection layer is N-type doping or P-type doping, the doping types of the ESD doped injection layers of two adjacent electrostatic discharge protection units are different.

18. The electrostatic discharge protection device according to claim 17, further comprises:
    a first electrode connected to the first N+ region and the first P+ region;
    a second electrode connected to the second N+ region and the second P+ region.

19. The electrostatic discharge protection device according to claim 11, wherein a trigger voltage of the electrostatic discharge protection device is determined by an injection dose and energy of the ESD doped injection layer.

20. The electrostatic discharge protection device according to claim 11, wherein a holding voltage of the electrostatic discharge protection device is determined by a size of the ESD doped injection layer.

* * * * *